US010099272B2

(12) United States Patent
Hall et al.

(10) Patent No.: US 10,099,272 B2
(45) Date of Patent: Oct. 16, 2018

(54) FORGING MACHINE WITH ROBOTIC HANDLER

(71) Applicant: National Machinery LLC, Tiffin, OH (US)

(72) Inventors: Aaron T. Hall, Carey, OH (US); Douglas M. Hoerig, Tiffin, OH (US); James A. Gase, Tiffin, OH (US)

(73) Assignee: NATIONAL MACHINERY LLC, Tiffin, OH (US)

( * ) Notice: Subject to any disclaimer, the term of this patent is extended or adjusted under 35 U.S.C. 154(b) by 0 days.

(21) Appl. No.: 15/712,249

(22) Filed: Sep. 22, 2017

(65) Prior Publication Data

US 2018/0021843 A1 Jan. 25, 2018

Related U.S. Application Data

(63) Continuation of application No. 14/631,948, filed on Feb. 26, 2015, now Pat. No. 9,802,242.

(51) Int. Cl.

| | |
|---|---|
| ***B21J 13/08*** | (2006.01) |
| ***B23Q 3/155*** | (2006.01) |
| ***B21D 37/04*** | (2006.01) |
| ***B21D 43/05*** | (2006.01) |
| ***B21K 27/04*** | (2006.01) |
| ***B21J 9/02*** | (2006.01) |
| ***B30B 15/02*** | (2006.01) |
| ***B21D 37/14*** | (2006.01) |

(52) U.S. Cl.

CPC ............ *B21J 13/085* (2013.01); *B21D 37/14* (2013.01); *B21D 43/057* (2013.01); *B21J 9/022* (2013.01); *B21K 27/04* (2013.01); *B30B 15/028* (2013.01); *H05K 999/99* (2013.01); *Y10S 483/901* (2013.01); *Y10T 483/16* (2015.01); *Y10T 483/1731* (2015.01)

(58) Field of Classification Search

CPC ............... Y10T 483/16; Y10T 483/165; Y10T 483/1729; Y10T 483/1731; Y10S 483/901; B21J 9/022; B21D 37/04; B21D 37/147; B21D 43/057; B23Q 3/1556; B23Q 3/15573

USPC ................................ 483/14, 15, 28, 29, 901

See application file for complete search history.

(56) References Cited

U.S. PATENT DOCUMENTS 4,304,041 A 12/1981 Kline et al.
4,387,502 A * 6/1983 Dom ...................... B21J 13/085 483/29

(Continued)

FOREIGN PATENT DOCUMENTS

JP 06234018 A * 8/1994 ........... B21D 5/0254

OTHER PUBLICATIONS

Draht 41 (1990) Kurzzeitiger Werkzeugwechsel beim Kaltmassivumformen erhoht die Wirtschaftlichkeit, pp. 795-799, XP000141375.

*Primary Examiner* — Sunil K Singh
*Assistant Examiner* — Michael Vitale
(74) *Attorney, Agent, or Firm* — Pearne & Gordon LLP

(57) ABSTRACT

A progressive cold forming machine and a robot for automatically changing a cutoff cassette, tooling cassettes, a transfer slide and transfer cam. A loading area adjacent the machine and robot has provisions for supporting a tooling cassette pallet and a transfer slide and camshaft pallet and a holding area for temporarily receiving some of the componentry being exchanged.

15 Claims, 8 Drawing Sheets

(56) References Cited

U.S. PATENT DOCUMENTS

| | | | | |
|---|---|---|---|---|
| 4,587,716 | A | 5/1986 | Bytow | |
| 4,635,342 | A * | 1/1987 | Balding | B23C 1/002 29/48.5 A |
| 4,637,121 | A | 1/1987 | Wortmann | |
| 4,649,622 | A | 3/1987 | Scott | |
| 4,860,428 | A | 8/1989 | Brolund | |
| 5,105,649 | A | 4/1992 | Hite et al. | |
| 5,176,604 | A | 1/1993 | Sakamura et al. | |
| 5,713,236 | A | 2/1998 | Genet et al. | |
| 5,735,782 | A | 4/1998 | Berg | |
| 5,811,951 | A * | 9/1998 | Young | B25J 9/042 318/568.1 |
| 5,829,302 | A | 11/1998 | Hite | |
| 6,021,361 | A * | 2/2000 | Taninaga | B24B 27/04 483/16 |
| 7,299,533 | B1 * | 11/2007 | Bickersteth | B23F 17/008 29/429 |

* cited by examiner

FORGING MACHINE WITH ROBOTIC HANDLER

This application is a continuation of application Ser. No. 14/631,948, filed Feb. 26, 2015.

BACKGROUND OF THE INVENTION

The invention relates to automatic changeover of tooling and workpiece transfer componentry in a progressive cold forming machine.

PRIOR ART

There exists a class of large progressive cold forming machines for shaping metal parts at high production rates. U.S. Pat. No. 5,829,302 discloses an example of such machines. These machines are characterized by tool cassettes disposed at successive workstations. Production capacity of these machines is at high rates so that a supply of parts can be produced in a relatively short time and, therefore, the machine can be used to produce different parts. When a production run is completed and a different part is to be produced, it is customary to changeover the tool cassettes, transfer slide mechanism and transfer operating camshaft. A changeover of the tooling and transfer-related componentry has been a relatively slow and labor intensive process. The die and tool cassettes are too heavy to be manually transported from the machine and the transfer slide and camshaft are even more impractical to manually transport. Typically, a hoist is used to lift these components to and from their operating positions in a machine. The procedure typically involves a technician who must step in and then exit the die area to guide a component out of the machine and onto a pallet or other receiving device. This process must then be reversed to load replacement tooling into the machine. There is a potential for mistakes or accidents where the technician is distracted or inattentive.

SUMMARY OF THE INVENTION

The invention provides a system for automatically changing the tooling cassettes, transfer slide, and transfer cam in a progressive cold former. A jointed arm shelf robot is mounted on the machine with its base vertically above and laterally outward of the die area. The robot arm is capable of reaching into the die area to remove and replace tool cassettes as well as reaching the transfer slide and transfer cam for removing and replacing these components. A robot loading or staging area is strategically arranged adjacent the forming machine.

As disclosed, a robot arm flange is fitted with distinct coupling devices. One device couples with the tooling cassettes, cutoff cassette, and a work platform. The other device engages a fixture for transporting the transfer slide or a fixture for transporting the camshaft. One section of the robot loading station is devoted to incoming and outgoing tool cassettes, cutoff cassette, transfer slide and camshaft and another section is devoted to docking of the transfer slide and camshaft transport fixtures and for temporary holding of outgoing cutoff cassette, transfer slide and camshaft. The tooling cassettes, cutoff cassette, and work platform are each fitted with a headed pin that enables them to be engaged with a relatively simple pneumatically operated coupling unit mounted slightly off center of the robot arm flange.

The transfer slide and transfer cam transport fixtures are selectively coupled to a master plate centered on the robot arm flange. The master plate has internal coupling elements, controlled by the robot, as is known to those skilled in the art, that receive and lock onto a tool plate forming part of a transport fixture. This master plate coupling allows the fixtures to be operated by the robot to securely lock onto the respective transfer slide or cam component and to maintain control of the orientation of the fixture and respective component.

DESCRIPTION OF THE PREFERRED EMBODIMENT

Figure 1:
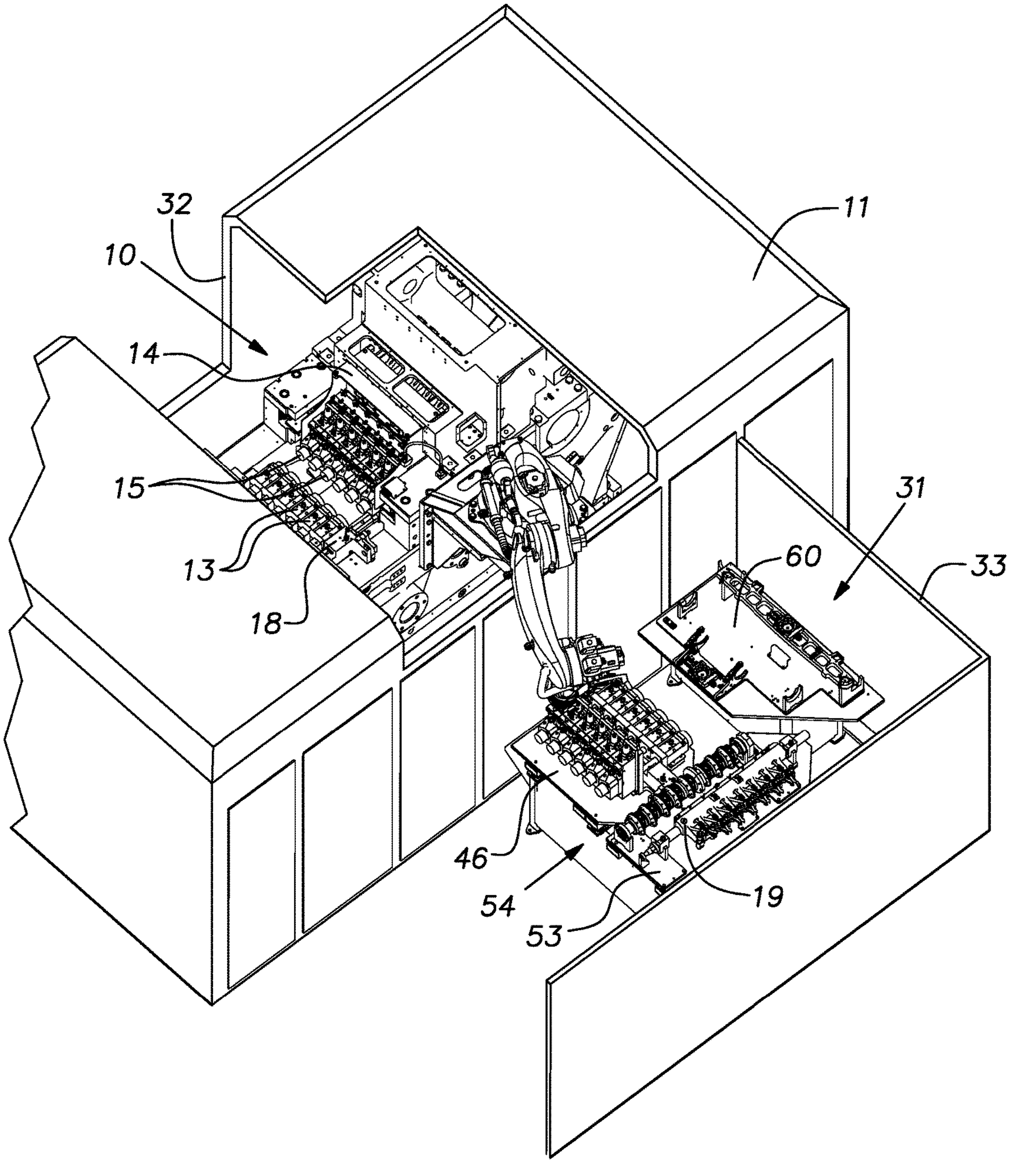
FIG. 1 is an isometric view of a progressive cold forming machine, tool changeover robot and robot loading area.
Figure 2:
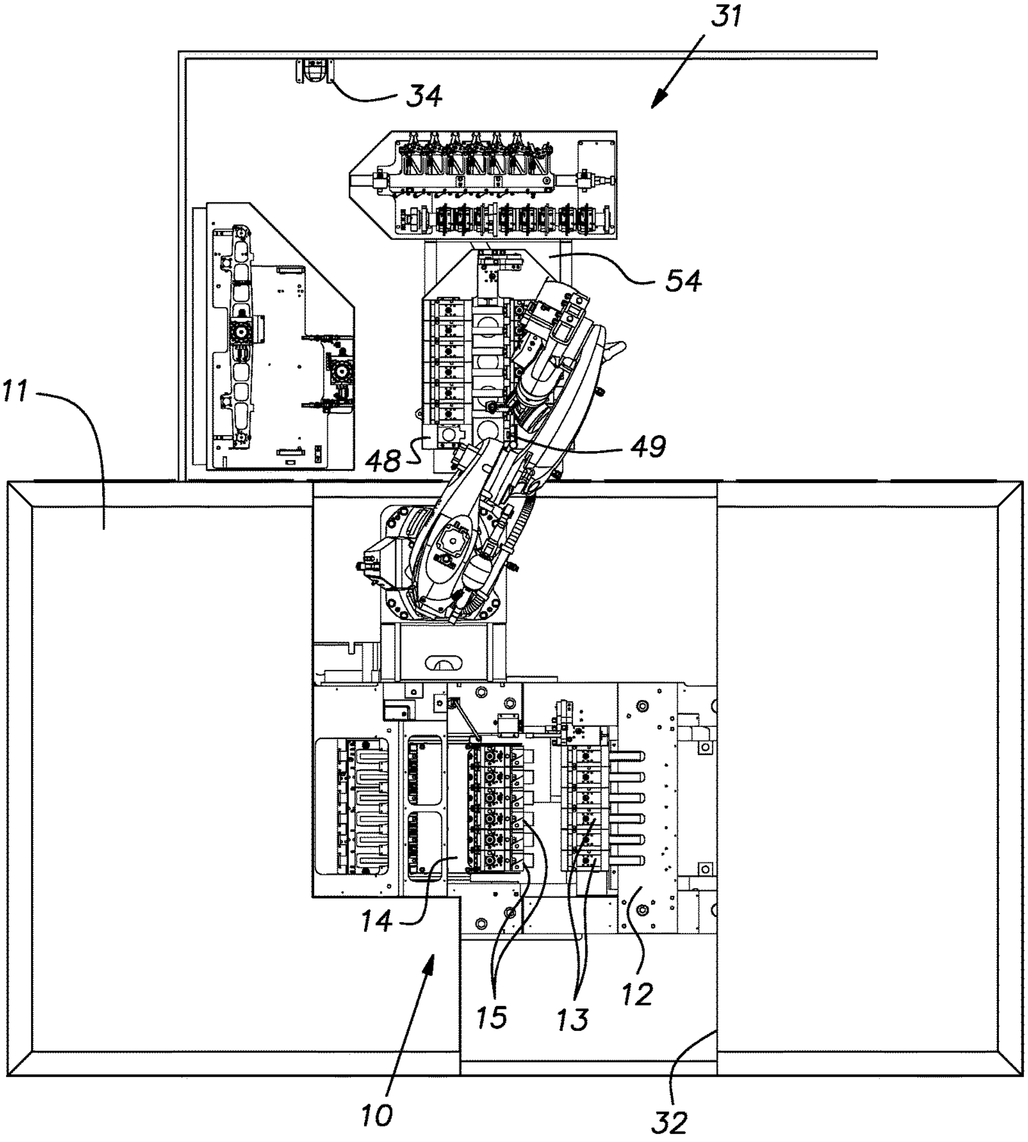
FIG. 2 is a plan view of the machine, robot and loading area illustrated in FIG. 1.
Figure 3:
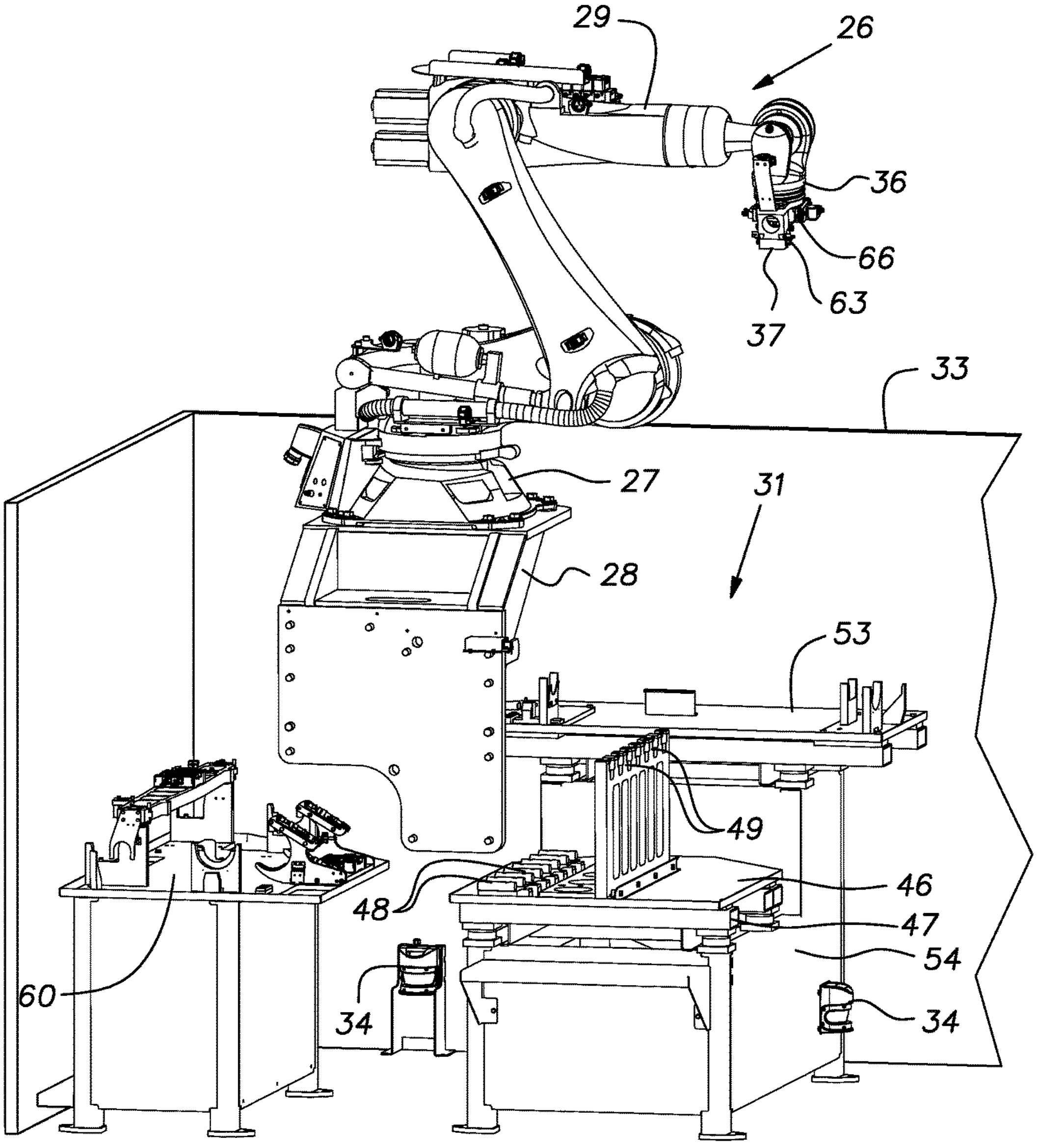
FIG. 3 is an isometric view of the robot and loading area from the machine side of the installation.

Referring in particular to FIGS. 1-3 a progressive cold forming machine is indicated at 10. The machine 10 is generally known to those skilled in the art and is disclosed in greater detail, for example, in aforementioned U.S. Pat. No. 5,829,302. The illustrated machine is surrounded by a sound reducing enclosure schematically illustrated at 11. The machine 10 has a stationary bolster 12 on which die cassettes 13 are mounted and a slide or ram 14 which reciprocates towards and away from the bolster and carries tool cassettes 15. The die and tool cassettes 13, 15 may sometimes be referred to as tool cassettes, cassettes, or tooling cassettes. Each pair of opposed die and tool cassettes 13, 15 are at an individual workstation. The workstations, as is conventional, are in a common horizontal plane. The area in the machine 10 between the die and tool cassettes 13, 15 is referred to as the die area.

Figure 4:
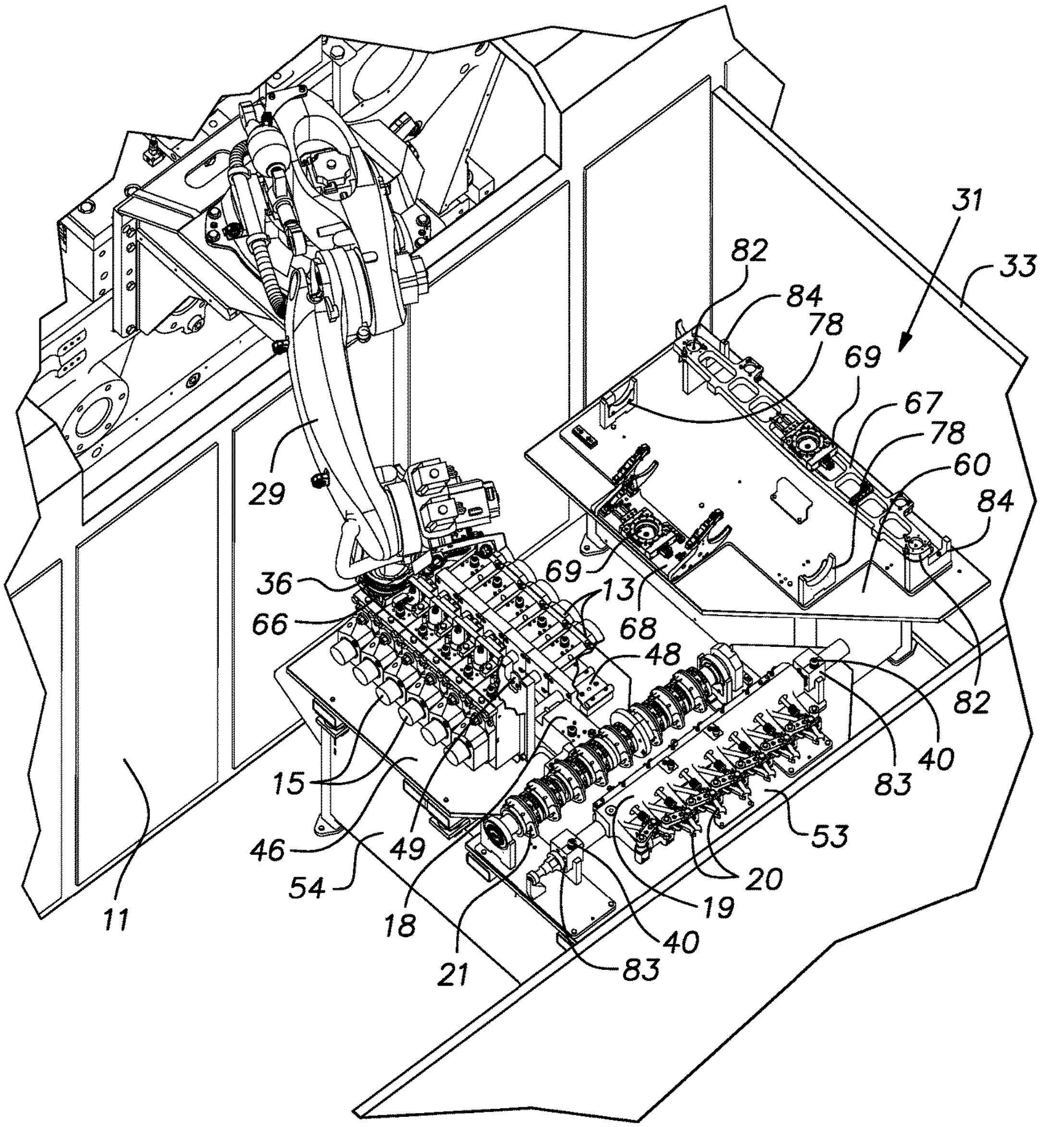
FIG. 4 is an isometric view of the robot and loading area on an enlarged scale from FIG. 1.
Figure 5:
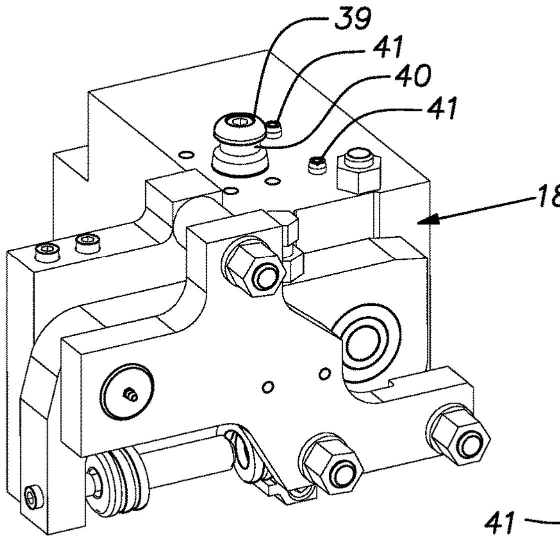
FIG. 5 is an isometric view of a cutoff cassette.

Metal blanks or workpieces are cut from a supply of wire or bar stock at a cutter cassette 18 mounted on the bolster 12. The blanks are transported to successive workstations by sets of fingers of a transfer slide 19, omitted from the machine 10 in FIGS. 1, 2 and 4, but shown out of the machine 10 in these FIGS. The transfer slide 19 is generally conventional, known to those skilled in the industry, and discussed in general in U.S. Pat. No. 5,713,236. In its operational position, the transfer slide 19 overlies the die cassettes 13. Blank gripping fingers 20 of the transfer slide 19 are operated by a camshaft 21 that is mounted on the machine 10 parallel to and forward (away from the ram 14) of the transfer slide.

As briefly discussed in the background, above, progressive cold formers operate at relatively high speed and afford high production rates. It is common to manufacture a particular part until a sufficient supply is obtained. Thereafter, tooling in the machine is changed by removing and replacing the cutoff cassette 18, tooling cassettes 13, 15, transfer slide 19 and transfer operating camshaft 21. Typically the elements being removed and replaced are dedicated to the production of a single product.

A six axis shelf robot 26 has its base 27 mounted on a bracket or pedestal 28 (FIG. 3) attached to the frame or bed of the machine 10. Preferably, the base 27 is supported above the machine frame so that it is mounted higher than the machine die area. As shown, the base 27 is horizontally offset from the die area both in the direction of slide motion (which is left to right to left in FIG. 2) and in the horizontal direction transverse to the slide direction, i.e. offset in a direction parallel to the plane of the face of the dies represented by the die cassettes 13. The offset of the robot base 27 in the direction of slide movement is preferably away from the bolster 12. An example of a suitable commercially available robot is marketed by Kuka, Model KR240R3100 Ultra K. The robot arm is designated 29.

A robot loading or staging area 31 is located on a side of the machine 10 opposite an operator's side. The operator's side is provided with a door or doors (not shown) at an opening 32 which allows access to the die area for inspection, adjustment, maintenance and the like.

The loading area 31 may be cordoned off at two sides by a fence 33 and protected by infrared sensors 34 which operate to suspend robot operation if a person or object enters the loading area.

Figure 6:
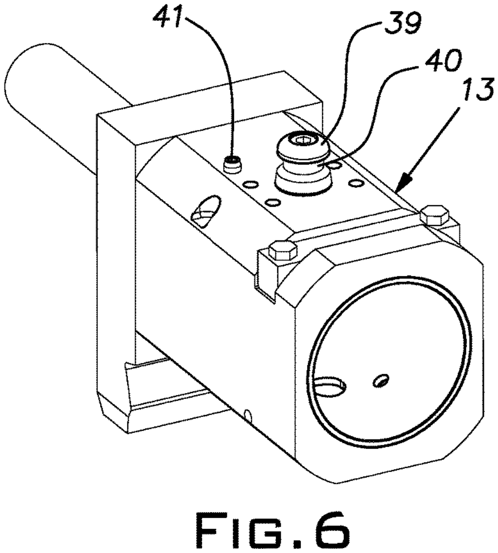
FIG. 6 is an isometric view of a typical die cassette.
Figure 7:
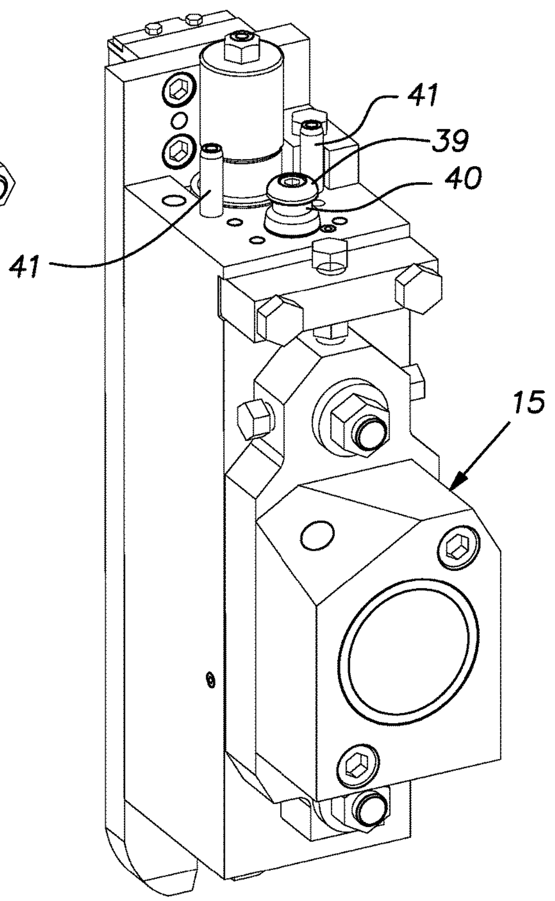
FIG. 7 is an isometric view of a typical tool cassette.

In the illustrated case, the machine 10 has 6 workstations with a pair of opposed tool and die cassettes 15, 13 used at each workstation. The die cassettes 13 are substantially identical to one another as are the tool cassettes 15. These cassettes are shown, respectively, in FIGS. 6 and 7.

A flange 36 on the distal end of the robot arm 29 carries a pneumatically operated coupling device 37. A suitable device is a clamping module marketed by Schunk GmbH & Co. under the trademark VERO-S, Model NSE plus 100-75. The coupling device or, simply, coupler 37 is eccentrically mounted on the flange 36 and has a generally rectangular box-like configuration, each side lying in a respective plane perpendicular to the plane of the flange 36. At its bottom center, the coupling device 37 has an opening adapted to admit a head or bulb 39 of a pin 40 (FIGS. 6 and 7) fixed on each of the tooling cassettes 13, 15 and other parts as discussed below.

The coupling device 37 admits a pin head 39 when the device is supplied with pressurized air and the angular orientation of the cassette (or certain other parts) is correct as determined by a pair of alignment pins 41 on the cassette or other body that register against the side of the block-like coupling device. When pressurized air is exhausted from the coupling device 37, internal spring-loaded latches lock onto the pin 40 and rigidly fix the body carrying the pin 40 relative to the robot arm flange 36. It will be understood that the air supply to the coupling device 37 is under control of the robot controller.

The robot 26 performs a tool changeover in part by removing the tooling cassettes 13, 15 from the machine 10 and replacing them with substitutes that have been delivered to the loading area 31. Typically, the substitute tooling cassettes 13, 15, and a cutoff cassette 18 are delivered to the loading area 31 on a pallet 46. The pallet 46 may be provided with rectangular tubes 47 for receiving the forks of a forklift truck.

The pallet 46 is constructed and arranged to carry both the die and tool cassettes 13, 15 in respective slots 48, 49. The robot arm 29 blocks the view of the empty slots 48, 49 in FIG. 4; portions of a die and tool cassette are broken away in this FIG. to reveal typical slots at the end of a row opposite the end where the empty slots exist. FIG. 3 illustrates a pallet 46 on which all of the slots 48, 49 are empty. The die cassette slots 48 are shallow areas separated by bars and the tool cassette slots 49 are characterized by a small central upstanding plate from which a tool cassette hangs. There is one extra slot 48, 49 for each tooling cassette over the number of die cassettes 13 and the number of tool cassettes 15 used in the operation of the machine 10, i.e. the number of machine workstations. In the illustrated case, there are six workstations and, therefore, 7 slots for each tooling cassette style.

A second pallet 53 is used to transport the replacement transfer slide 19 and camshaft 21 to the loading area 31. The pallets 46, 53 are supported on a permanent or stationary bi-level stand 54 in a zone in the loading area 31. The stand 54 supports the bottom of the cassette pallet 46 at a height of, say, between 29 to 39 inches, which is a convenient bench height for supporting the tools where they can be manually inspected, adjusted, or replaced. The higher level of the stand 54 presents the transfer slide 19 and camshaft 21 on the pallet 53 where they can be reached by the robot arm so as to limit the necessary length of the arm.

The tooling cassettes 13, 15 are changed one at a time. The robot 26 is programmed to remove one of the cassettes in the machine 10 by engaging the pin 40 with the coupling device 37 and to place the cassette in a corresponding extra open slot 48 or 49 at one end of the respective slot row on the pallet 46. The robot 26 then engages the coupler device 37 with the replacement cassette on the pallet 46 and transports it to a position in the workstation of the machine 10 vacated by the previously removed cassette. Thereafter, the robot picks up a next cassette in the machine 10 and places it in the pallet slot vacated by the most recently installed replacement cassette.

This process is repeated until all the cassettes of one style have been exchanged, and then the process is restarted with the other style of cassette. The pallet 46 is arranged to hold the die and tool cassettes 13, 15 facing outward away from one another and the robot 26 is programmed and operates to position the cassettes accordingly. This arrangement enables a technician full access to the tooling for inspection, adjustment, repair, and the like.

When a changeover of the tool cassettes is completed, an empty slot 48, 49 will exist on an end of the slot rows opposite the end where a slot existed at the beginning of a changeover. This procedure reduces the space required on a pallet and the distance and/or complexity of robot arm movement to accomplish a changeover. The robot need only move the distance between adjacent cassettes 13 or 15 after depositing a cassette being replaced into a slot or a workstation. To facilitate this technique, the robot has a scanning device 63 on or adjacent the flange 36. The robot is programmed to sweep over a row of cassette slots on the pallet 46 to determine what end of the row of cassette slots an original empty slot is at and is programmed to bring the first tooling cassette from the machine 10 to that open slot. The pallet 46 is used to transport the cutoff cassette 18 associated with the die and tool cassettes being transported by the pallet. During a changeover, the cutoff cassette 18 in the machine 10 is first removed by the flange mounted coupling device 37 engaged with a pin 40 on the cassette and is temporarily placed on a permanent fixed stand 60 forming a changeover holding station in the loading area 31 at a zone adjacent the bi-level stand 54. The robot 26 then moves the replacement cutoff cassette 18 to its station on the machine 10 adjacent the die cassette 13 at the first workstation. At some point thereafter, the robot 26 shifts the original cutoff cassette 18 from the platform or permanent stand 60 to the pallet 46 in the space originally occupied by the replacement cutoff cassette.

The transfer slides 19 and camshafts 21 are transported by the robot arm 29 using a master plate or coupler 66 such as that marketed by ATI Industrial Automation under the Model No. QC-210. The master plate 66 is centrally fixed to the robot arm flange 36 and provides a plurality of both pneumatic and electrical circuits as is known to those skilled in the art.

Separate fixtures 67 (FIG. 8), 68 (FIG. 9) are provided for interfacing between the robot carried master plate 66 and the transfer slide 19 and camshaft 21. The fixtures 67, 68 each include a tool plate 69 that mates with and is selectively gripped by the master plate 66.

Figure 9:
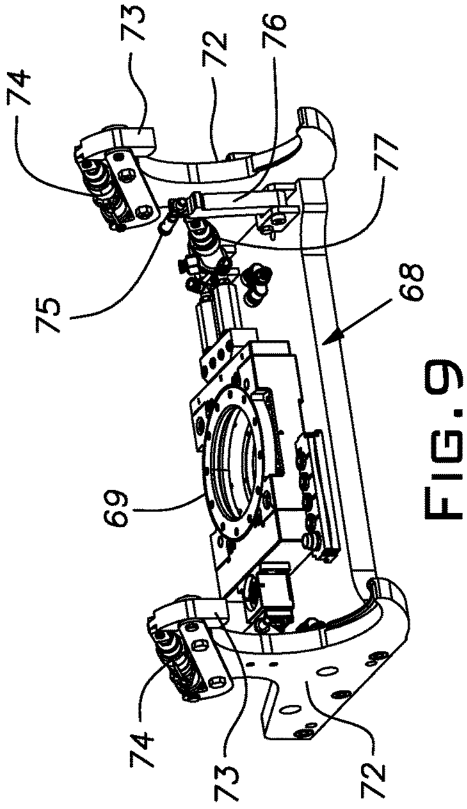
FIG. 9 is an isometric view of a camshaft transport fixture.

Referring now to FIG. 9, the camshaft transport fixture 68 has a pair of spaced end plates forming arms 72 that are received under the camshaft 21 and work as a cradle to lift the camshaft. The camshaft 21 is locked in the cradle arms 72 by levers 73 operated by pneumatic cylinders 74 controlled by the robot 26 through a circuit running through the master plate 66. Proper functioning of the levers 73 is confirmed by a proximity sensor (not shown). A lever 76 similarly operated by the robot with a pneumatic cylinder 77 indexes into a notch in the camshaft 21 to hold a reference angular orientation of the camshaft. A proximity sensor 75 on the lever 76 confirms that the lever is seated in the notch before the camshaft 21 is transported by the robot 26.

During a changeover, the robot 26 after retrieving the fixture 68 from an assigned location on the changeover holding station 60 removes the camshaft 21 from the machine 10 and delivers it into cradle brackets 78 on the holding station. The replacement camshaft is picked up from the pallet 53 and set in the machine 10. Next, the robot 26 returns to the holding station 60, picks up the camshaft being replaced and places it on the pallet 53. Thereafter, the fixture 68 is returned by the robot 26 to its assigned place on the holding station 60.

Figure 8:
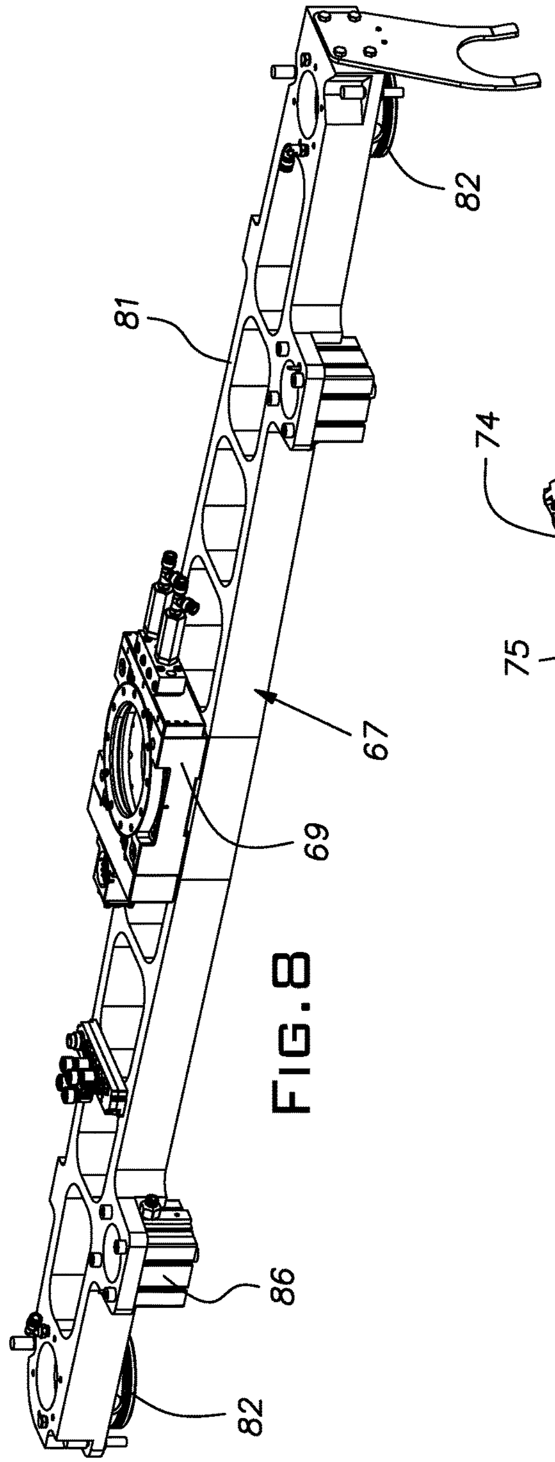
FIG. 8 is an isometric view of a transfer slide transport fixture.
Figure 10A:
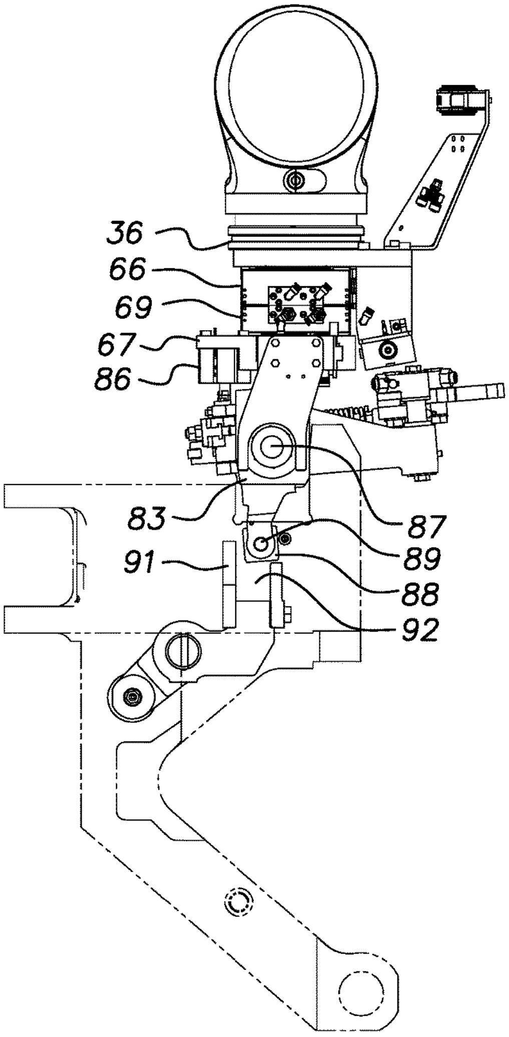
FIGS. 10A and 10B are views showing installation of the transfer slide performed by the robot.
Figure 10B:
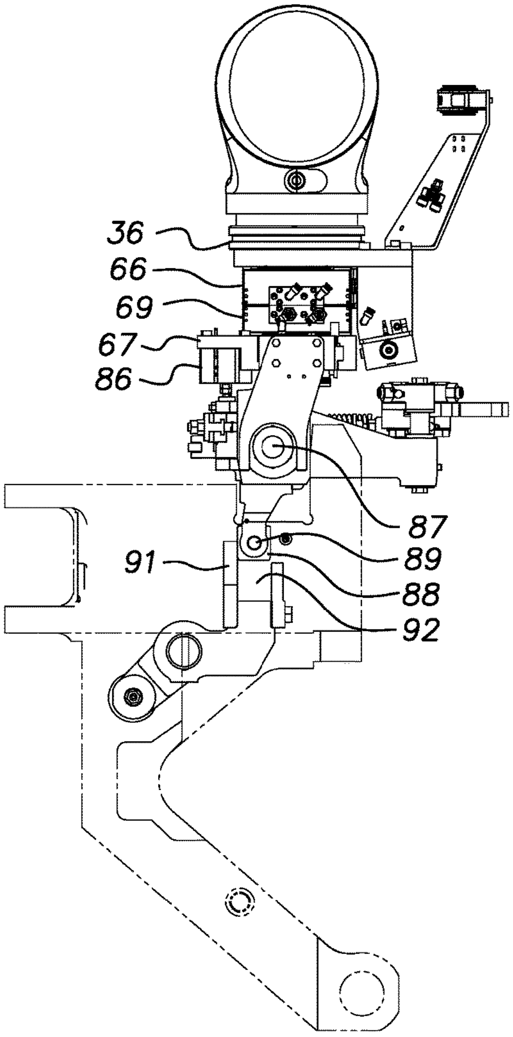

FIG. 8 illustrates the fixture 67 for transporting the transfer slide 19. The fixture 67 has a ladder frame 81 to which the tool plate 69 is attached. Coupling devices 82 adjacent each end of the frame 81 are pneumatically operated by the robot 26. The devices 82 are similar to the coupling device 37 on the robot flange 36 and when pressurized by the robot 26 are adapted to couple with pins 40 fixed on trunnion blocks 83 of the transfer slide 19. During changeover of a transfer slide 19, the fixture 67 is retrieved by the robot 26 from the holding station 60. In the illustrated case, the fixture is parked at the holding station 60 by using the coupling devices 82 to engage pins 40 (covered by the devices 82 in FIG. 4) fixed on the holding station. The transfer slide 19 in the machine 10 is removed by the robot 26 with the fixture coupling units or devices 82 engaging pins 40 on the transfer slide. The removed transfer slide 19 is temporarily placed on brackets 84 at the holding station 60. The replacement transfer slide is picked up from the pallet 53 by the robot and installed in the machine. The fixture 67 includes a pair of short stroke vertically acting pneumatic cylinders 86 operated by the robot 26 through the master plate 66. The cylinders 86, when pressurized, overcome the effect the center of gravity of the transfer slide 19 being offset from the axis, designated 87 (FIGS. 10A, 10B) of bores in the trunnion blocks 83 and tilt the transfer slide counterclockwise in FIG. 10A. The robot 26 suspends the transfer slide 19 above its operating positon in the machine 10 and then releases air from the cylinders 86. The transfer slide 19 tends to pivot, clockwise in FIG. 10A with the result that a block 88, freely pivotal on a shaft 89, is biased against a plate 91. The block 88 is thus positively aligned with a slot 92, partially formed by the plate 91, in which the block ultimately operates in the machine 10 to pivot the transfer fingers 20 away from the faces of the die cassettes 13. After release of the air in the pneumatic cylinders 86 and alignment of the block 88, the robot lowers the transfer slide 19 into its operational position in the machine 10 with the block 88 being fully received in the slot 92. Thereafter, the removed transfer slide 19 is lifted from the changeover station 60 and delivered onto the pallet 53 by the robot 26. The fixture 67 is then returned to its assigned space on the changeover holding station 60. With a changeover completed, the pallets 46, 53 can be removed from the loading area 31 to a remote storage area and/or to a tooling room for inspection and service.

Figure 11:
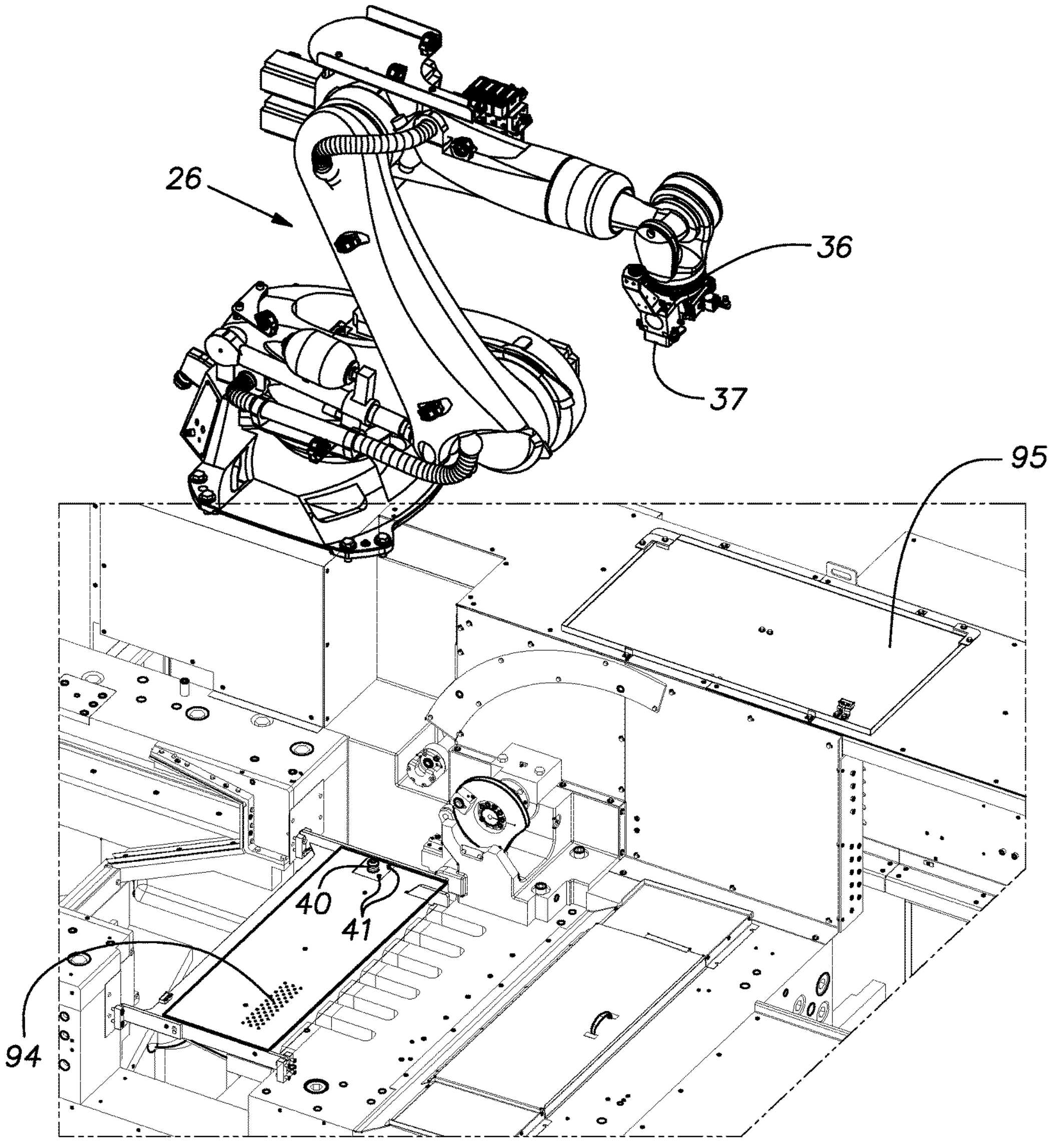
FIG. 11 is a schematic isometric view of a portion of the machine, shown in phantom, the robot, and a service platform installed and removed by the robot.

With reference to FIG. 11, the robot 26 is employed to install and remove a work platform 94. The platform 94 is installed when the machine is shut down for service, inspection, and the like. The platform 94 allows a technician to stand and service the transfer slide 19 at a convenient height when the transfer slide is swung up to a service position. The platform 94 is a generally flat panel that, in the installed position shown in FIG. 11, bridges across the die area. The robot coupling device 37 couples with a pin 40 adjacent one end of the platform 94. Alignment pins 41 on the platform maintain a fixed angular orientation between the robot flange 36 and the platform 94. The robot 26 transports the platform 94 between the installed position and a rectangular storage area 95 above the machine 10 where it resides during operation of the machine.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. An apparatus comprising:

a progressive forming machine having a station with a cutoff cassette for cutting blanks from a supply of wire stock or bar stock;

a plurality of workstations with tooling cassettes for forming the blanks; and a shelf robot for automatically changing the cutoff cassette and tooling cassettes, the robot having, a base that is fixed from linear movement; and a robot arm that is movable in six axes with respect to the base, the robot arm having a flange distal from an end of said robot arm that is supported from below by the base, and a coupling device that is disposed on the flange, wherein the cutoff cassette and tooling cassettes each have a respective coupling element that is formed as a bulbous pin, each bulbous pin being engageable by the coupling device to enable the corresponding cutoff cassette or tooling cassette to be transported to and from the progressive forming machine by the robot.

2. The apparatus as set forth in claim 1, wherein the respective coupling elements of the cutoff cassette and the tooling cassettes are identical.

3. The apparatus as set forth in claim 1, wherein the cutoff cassette and the tooling cassettes each include a respective formation adjacent the bulbous pin thereof to angularly orient a selected cassette relative to the coupling device.

4. The apparatus as set forth in claim 1, wherein the progressive forming machine includes a transfer slide and a transfer camshaft, each of which is mountable on the distal flange via a transport apparatus for transport to and from the progressive forming machine.

5. The apparatus as set forth in claim 4, wherein said transport apparatus includes a first fixture for carrying the transfer slide and a second fixture for carrying the transfer camshaft, said first and second fixtures having respective tool plates that are compatible with a master plate mounted on the robot arm flange.

6. The apparatus as set forth in claim 5, wherein each of said first and second fixtures have respective actuators operated by the robot that function to inter-engage elements with respective parts of the transfer slide and the transfer camshaft.

7. The apparatus as set forth in claim 1, further including a displaceable work platform moveable between a die area of the progressive forming machine and a storage area, which is adjacent the progressive forming machine, the work platform having a coupling element engageable by the coupling device to enable the work platform to be transported between the die area and the storage area by the robot.

8. The apparatus as set forth in claim 7, wherein the work platform coupling element is identical to the respective coupling elements of the cutoff cassette and the tooling cassettes.

9. The apparatus as set forth in claim 1, wherein the base of said robot is mounted vertically above and horizontally offset from the progressive forming machine out of a die area thereof.

10. The apparatus as set forth in claim 9, wherein the base is mounted laterally away from an operator station.

11. The apparatus as set forth in claim 1, including a loading area that is disposed adjacent the progressive forming machine for supplying and receiving cutoff and tooling cassettes, transfer slides, and transfer camshafts to and from the robot.

12. The apparatus as set forth in claim 11, wherein the loading area has dedicated zones for simultaneously storing two transfer slides, two transfer camshafts, two cutoff cassettes, and more tooling cassettes than the progressive forming machine has workstations.

13. The apparatus as set forth in claim 12, wherein each of the tooling cassettes comprises an associated tool cassette and a die cassette, and the loading area dedicated zone for tooling cassettes has only one space more for each tool cassette and each die cassette than the number of workstations of the progressive forming machine.

14. The apparatus as set forth in claim 12, wherein the loading area includes a support for both a tooling cassette pallet and a transfer slide and transfer camshaft pallet.

15. The apparatus as set forth in claim 14, wherein the support is a bi-level arrangement wherein the tooling cassette pallet is lower and more proximal to the progressive forming machine than the transfer slide and cam shaft pallet.

* * * * *